(12) United States Patent
Hwang (10) Patent No.: US 8,153,465 B2
(45) Date of Patent: Apr. 10, 2012

(54) IMAGE SENSOR AND METHOD FOR MANUFACTURING THE SAME

(75) Inventor: Joon Hwang, Chungbuk (KR)

(73) Assignee: Dongbu Hitek Co., Ltd., Seoul (KR)

( * ) Notice: Subject to any disclaimer, the term of this patent is extended or adjusted under 35 U.S.C. 154(b) by 118 days.

(21) Appl. No.: 12/566,848

(22) Filed: Sep. 25, 2009

(65) Prior Publication Data

US 2010/0078752 A1 Apr. 1, 2010

(30) Foreign Application Priority Data

Sep. 30, 2008 (KR) ........................ 10-2008-0096098

(51) Int. Cl.
*H01L 21/00* (2006.01)
(52) U.S. Cl. .................... 438/57; 438/455; 257/E21.575
(58) Field of Classification Search .......... 438/455–459, 438/57–98; 257/E21.575
See application file for complete search history.

(56) References Cited

FOREIGN PATENT DOCUMENTS

| KR | 10-2005-0117674 A | 12/2005 |
| KR | 10-2007-0094407 A | 9/2007 |
| KR | 10-2010-0012641 A | 2/2010 |

*Primary Examiner* — Matthew Reames
(74) *Attorney, Agent, or Firm* — Saliwanchik, Lloyd & Eisenschenk (57) ABSTRACT

An image sensor and manufacturing method thereof are provided. The image sensor includes a readout circuitry, an electrical junction region, an interconnection, and an image sensing device. The readout circuitry can be disposed at a first substrate, and the electrical junction region can be electrically connected to the readout circuitry at the first substrate. The interconnection can be disposed in an interlayer dielectric on the first substrate and electrically connected to the electrical junction region. The image sensing device can include a first conductive type layer and a second conductive type layer on the interconnection.

9 Claims, 7 Drawing Sheets

IMAGE SENSOR AND METHOD FOR MANUFACTURING THE SAME

CROSS-REFERENCE TO RELATED APPLICATIONS

This application claims the benefit under 35 U.S.C. §119 of Korean Patent Application No. 10-2008-0096098, filed on Sep. 30, 2008, which is hereby incorporated by reference in its entirety.

BACKGROUND

An image sensor is a semiconductor device that converts an optical image into an electric signal. Image sensors can be classified into charge coupled device (CCD) image sensors and complementary metal oxide semiconductor (CMOS) image sensors (CIS).

During the fabrication of image sensors, a photodiode can be formed in a substrate using ion implantation. As the size of photodiodes continue to get smaller for the purpose of increasing the number of pixels without increasing chip size, the area of a light receiving portion in an image sensor is also reduced. This results in a reduction in image quality.

Also, since the height of a stack does not reduce as much as the area of the light receiving portion reduces, the number of photons incident to the light receiving portion also decreases. This is due to diffraction of light sometimes called an Airy disk.

To address this limitation, a photodiode can be formed using amorphous silicon (Si), or readout circuitry can be formed in a silicon (Si) substrate using a method such as wafer-to-wafer bonding. Also, a photodiode can be formed on and/or over the readout circuitry (referred to as a three-dimensional (3D) image sensor). The photodiode can be connected with the readout circuitry through a metal interconnection.

In the related art, when a cleaving process after bonding wafers and an etch process for dividing a device by pixel are performed, a damaged lattice structure can cause a dangling bond, resulting in generation of a dark current.

Also, both the source and the drain of the transfer transistor are heavily doped with N-type impurities, leading to a charge sharing phenomenon. When the charge sharing phenomenon occurs, the sensitivity of an output image is reduced and an image error may be generated.

In addition, because a photo charge does not readily move between the photodiode and the readout circuitry, a dark current is generated and/or saturation and sensitivity can be reduced.

In addition, a contact plug connecting the readout circuitry and the photodiode can cause a short in the photodiode.

BRIEF SUMMARY

Embodiments of the present invention provide an image sensor that can inhibit the occurrence of a dangling bond of a silicon surface, and a method for manufacturing the same.

Embodiments also provide an image sensor where a charge sharing phenomenon can be inhibited while also increasing a fill factor, and a method for manufacturing the same.

Embodiments also provide an image sensor that can minimize a dark current source and inhibit saturation reduction and sensitivity degradation by forming a smooth transfer path of a photo charge between a photodiode and a readout circuitry, and a method for manufacturing the same.

Embodiments also provide an image sensor that can inhibit a short at a contact plug connecting a readout circuitry and an image sensing device, and a method for manufacturing the same.

In one embodiment, a method for manufacturing an image sensor can comprise: forming a readout circuitry on a first substrate; forming an interlayer dielectric on the first substrate; forming an interconnection in the interlayer dielectric, the interconnection being electrically connected to the readout circuitry; providing a second substrate with an image sensing device, the image sensing device comprising a first conductive type layer and a second conducting type layer; bonding the second substrate on the interlayer dielectric; removing a portion of the second substrate that does not include the image sensing device; and performing a first wet etch process on an exposed surface of the image sensing device after removing a portion of the second substrate.

In another embodiment, an image sensor can comprise: a readout circuitry at a first substrate; an electrical junction region electrically connected to the readout circuitry; an interlayer dielectric disposed on the first substrate; an interconnection in the interlayer dielectric and electrically connected to the electrical junction region; and an image sensing device on the interconnection, the image sensing device comprising a first conductive type layer and a second conductive type layer.

The details of one or more embodiments are set forth in the accompanying drawings and the detailed description below. Other features will be apparent to one skilled in the art from the detailed description, the drawings, and the appended claims.

DETAILED DESCRIPTION

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 1:
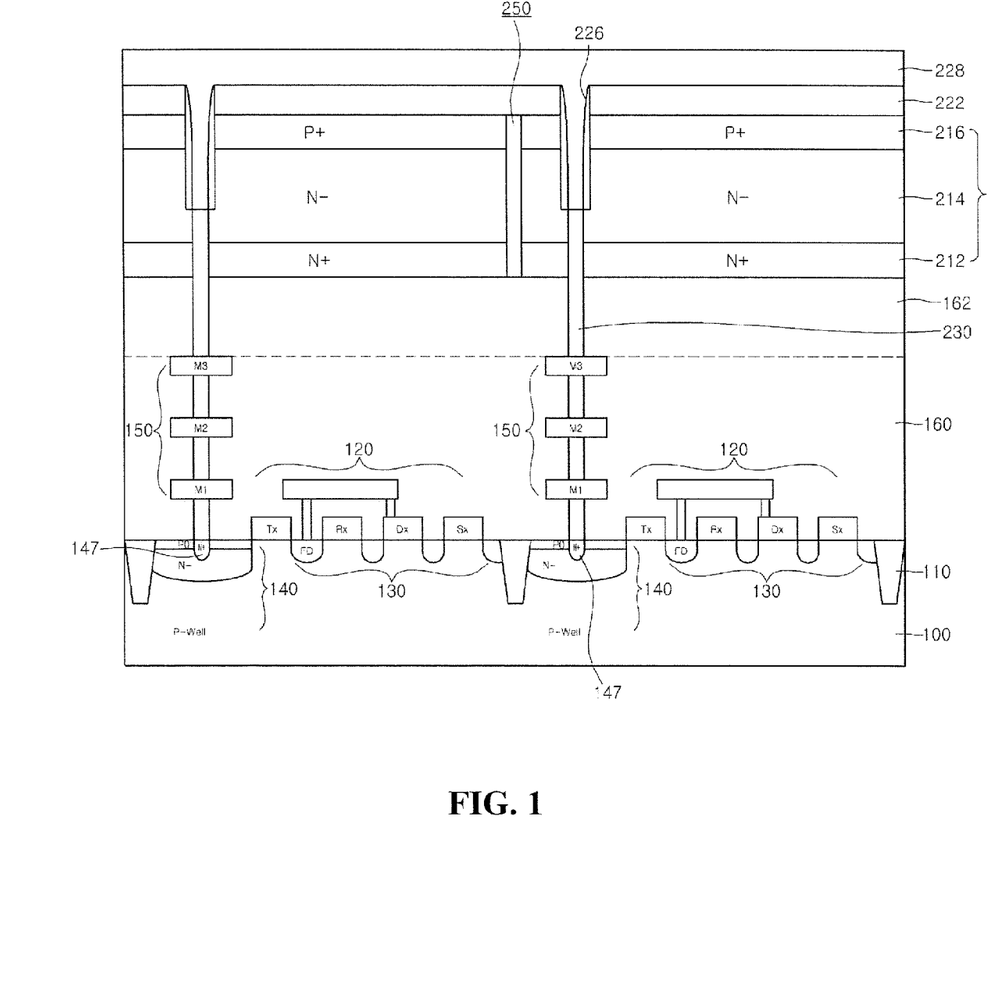
FIG. 1 is a cross-sectional view showing an image sensor according to an embodiment of the present invention.

FIG. 1 is a cross-sectional view showing an image sensor according to an embodiment of the present invention.

Referring to FIG. 1, in an embodiment, an image sensor can include: a readout circuitry 120 at a first substrate 100; an electrical junction region 140 electrically connected to the readout circuitry 120 at the first substrate 100; a first interlayer dielectric 160 disposed on the first substrate 100; an interconnection 150 disposed in a first interlayer dielectric 160 and electrically connected to the electrical junction region 140; a second interlayer dielectric 162 disposed on the interconnection 150; and an image sensing device 210 on the second interlayer dielectric 162. The image sensing device 210 can include a first conductive type second layer 214 and a second conductive type layer 216.

The image sensor can also include: a contact plug 230 electrically connecting the first conductive type second layer 214 to the interconnection 150 through a via hole passing through the image sensing device 210; and a sidewall dielectric 226 disposed on a sidewall of the second conductive type layer 216 within the via hole.

The image sensing device 210 can be a photodiode, though embodiments of the subject invention are not limited thereto. For example, the image sensing device 210 can be a photogate or a combination of a photodiode and a photogate. In one embodiment, the image sensing device 210 can be a photodiode formed in a crystalline semiconductor layer. In another embodiment, the image sensing device 210 can be a photodiode formed in an amorphous semiconductor layer.

Hereinafter, a method for manufacturing an image sensor according to an embodiment will be described with reference to FIGS. 2 to 12.

Figure 2:
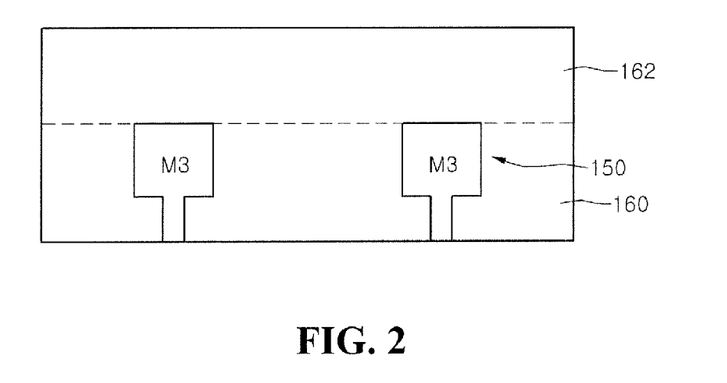
FIGS. 2 to 12 are cross-sectional views showing a method for manufacturing an image sensor according to an embodiment of the present invention.
Figure 3:
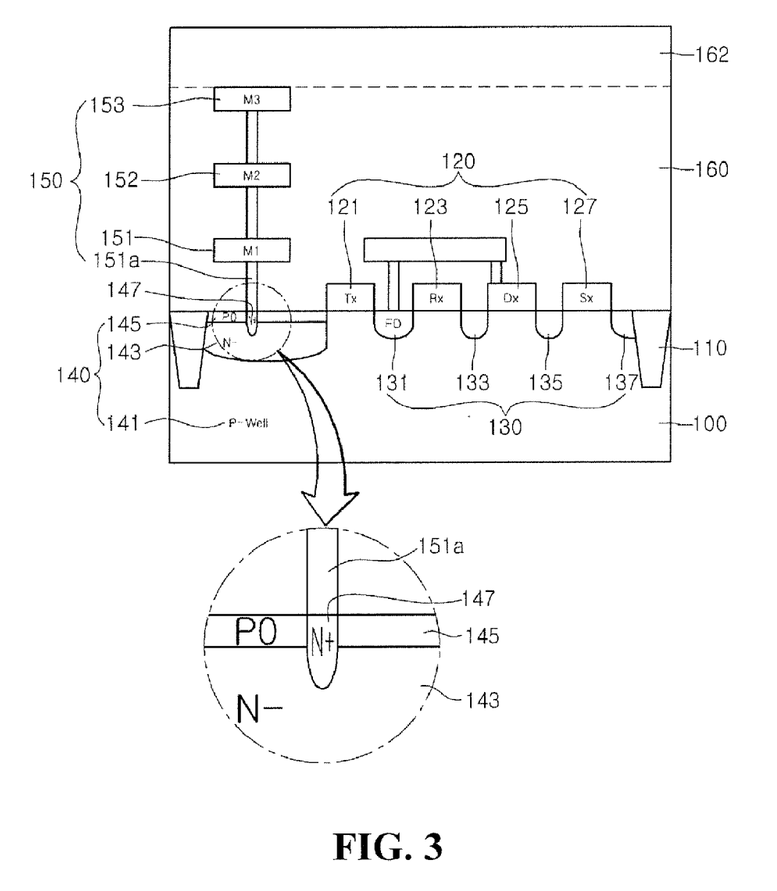

FIG. 2 is a schematic view illustrating the first substrate 100 provided with the interconnection 150. FIG. 3 is a detailed view including some of the features of FIG. 2.

Referring to FIG. 3, an active region can be defined by forming a device isolation layer 110 in the first substrate 100. The readout circuitry 120 can include, for example, a transfer transistor (Tx) 121, a reset transistor (Rx) 123, a drive transistor (Dx) 125, and a select transistor (Sx) 127. An ion implantation region 130 can be formed. The ion implantation region 130 can include, for example, a floating diffusion region (FD) 131 and source/drain regions 133, 135, and 137 for the transistors.

In an embodiment, an electrical junction region 140 can be formed on the first substrate 100, and a first conductive type connection 147 can be formed connected to the interconnection 150 at an upper part of the electrical junction region 140.

For example, the electrical junction region 140 can be a P-N junction 140, though embodiments of the subject invention are not limited thereto. In an embodiment, the electrical junction region 140 can include a first conductive type ion implantation layer 143 formed on a second conductive type well 141 or a second conductive type epitaxial layer, and a second conductive type ion implantation layer 145 formed on the first conductive type ion implantation layer 143. For example, the electrical junction region 140 can be a P0 (145)/N− (143)/P− (141) junction, though embodiments of the subject invention are not limited thereto. The first substrate 100 can be a second conductive type substrate, though embodiments of the present invention are not limited thereto.

In an embodiment, the device can be designed to provide a potential difference between the source and drain of the transfer transistor (Tx), thereby enabling the full dumping of a photo charge. Accordingly, a photo charge generated in the photodiode can be dumped to the floating diffusion region, thereby increasing the output image sensitivity.

Specifically, electrons generated in the photodiode 210 can be transferred to the electrical junction region 140, and they can be transferred to the floating diffusion (FD) 131 node to be converted into a voltage when the transfer transistor (Tx) 121 is turned on.

The maximum voltage of the electrical junction region 140 (e.g., a P0/N−/P− junction) can become a pinning voltage, and the maximum voltage of the FD 131 node can become Vdd minus the threshold voltage (Vth) of the reset transistor (Rx). Therefore, due to a potential difference between the source and drain of the Tx 131, without charge sharing, electrons generated in the photodiode 210 on the chip can be completely dumped to the FD 131 node.

Thus, unlike a related art device which connects a photodiode to an N+ junction, an embodiment of the present invention makes it possible to inhibit saturation reduction and sensitivity degradation.

The first conductive type connection 147 can be formed between the photodiode and the readout circuit to create a smooth transfer path of a photo charge, thereby making it possible to minimize a dark current source and inhibit saturation reduction and sensitivity degradation.

To this end, in an embodiment, an N+ doping region can be formed as the first conductive type connection 147 for an ohmic contact on the surface of the electrical junction region 140 (e.g., a P0/N−/P− junction). The N+ region (147) can be formed such that it penetrates the P0 region (145) to contact the N− region (143).

In an embodiment, the width of the first conductive type connection 147 can be minimized to inhibit the first conductive type connection 147 from being a leakage source. To this end, a plug implant can be performed after etching a contact hole for a first metal contact 151a, though embodiments of the present invention are not limited thereto. For example, an ion implantation pattern (not shown) can be formed, and the ion implantation pattern can be used as an ion implantation mask when forming the first conductive type connection 147.

Next, the interlayer dielectric 160 can be formed on the first substrate 100, and the interconnection 150 can be formed. The interconnection 150 can include, for example, the first metal contact 151a, a first metal 151, a second metal 152, and a third metal 153, though embodiments of the subject invention are not limited thereto.

The second interlayer dielectric 162 can be formed on the interconnection 150. The second interlayer dielectric 162 can be formed of any suitable material known in the art; for example, a dielectric such as an oxide layer or a nitride layer. The second interlayer dielectric 162 can increase bonding force of a second substrate (not shown) provided with the first substrate 100 and the image sensing device 210.

Figure 4:
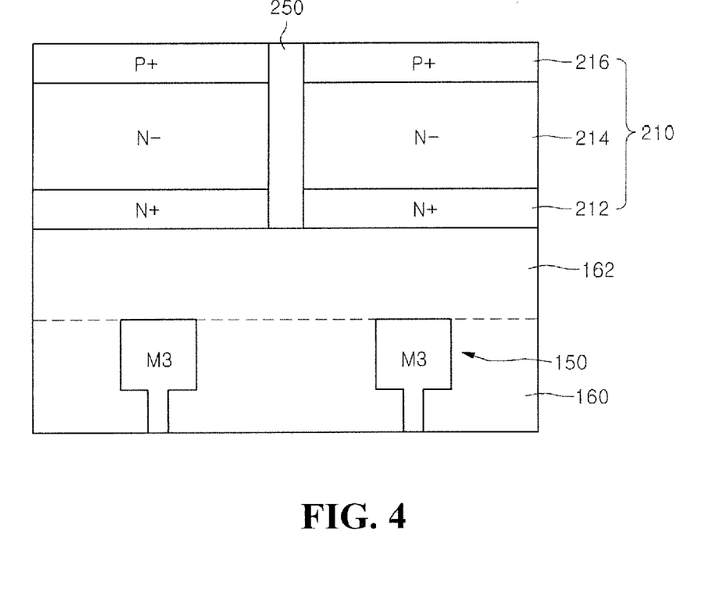

Referring to FIG. 4, the image sensing device 210 including the first conductive type second layer 214 and the second conductive type layer 216 can be formed on the second interlayer dielectric 162.

For example, a crystalline semiconductor layer of a second substrate can be provided with a photodiode including an N− layer (a first conductive type second layer 214) and a P+ layer (a second conductive type layer 216). An N+ layer (a first conductive type first layer 212) can also be provided for an ohmic contact.

In an embodiment, a bonding operation can be performed such that the image sensing device 210 of the second substrate corresponds to (and is directly over) the interconnection 150 of the first substrate 100. Thereafter, a portion of the second substrate can be removed such that just the image sensing device 210 remains from the second substrate. In this case, according to an embodiment, a first wet etch can be performed on surfaces of the image sensing device 210 exposed by removing the second substrate. For example, the first wet etch can be performed with a tetramethylammonium hydroxide (TMAH) solution, though embodiments of the present invention are not limited thereto. According to embodiments of the present invention, a dangling bond of a damaged silicon surface can be removed through a wet etch process, so as to inhibit the occurrence of a dark current.

Thereafter, the image sensing device 210 can be divided by pixel through an inter-pixel separation layer 250. For example, the inter-pixel separation layer 250 can be formed of a dielectric such as an oxide layer, though embodiments of the present invention are not limited thereto. The inter-pixel separation layer 250 can be formed through, for example, ion implantation. In an embodiment, the inter-pixel separation layer 250 can be formed after forming the contact plug 230.

According to an embodiment, when the inter-pixel separation layer 250 is formed as a dielectric through an etch process, a second wet etch process can be performed on pixel boundary surfaces of the image sensing device 210 exposed through the etch process. For example, the second wet etch can be performed with a TMAH solution, though embodiments are not limited thereto. According to embodiments, a dangling bond of a damaged silicon surface can be removed through a wet etch process, so as to inhibit the occurrence of a dark current.

Figure 5:
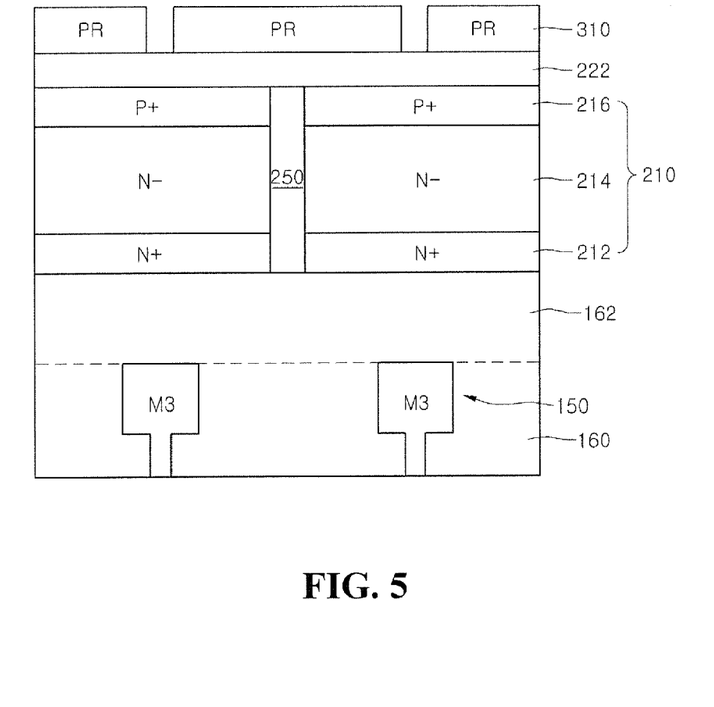

Referring to FIG. 5, a first dielectric 222 can be formed on the image sensing device 210, and a photoresist pattern 310 for forming first via holes can be formed. The first dielectric 222 can be, for example, an oxide layer or a nitride layer, though embodiments of the present invention are not limited thereto.

Figure 6:
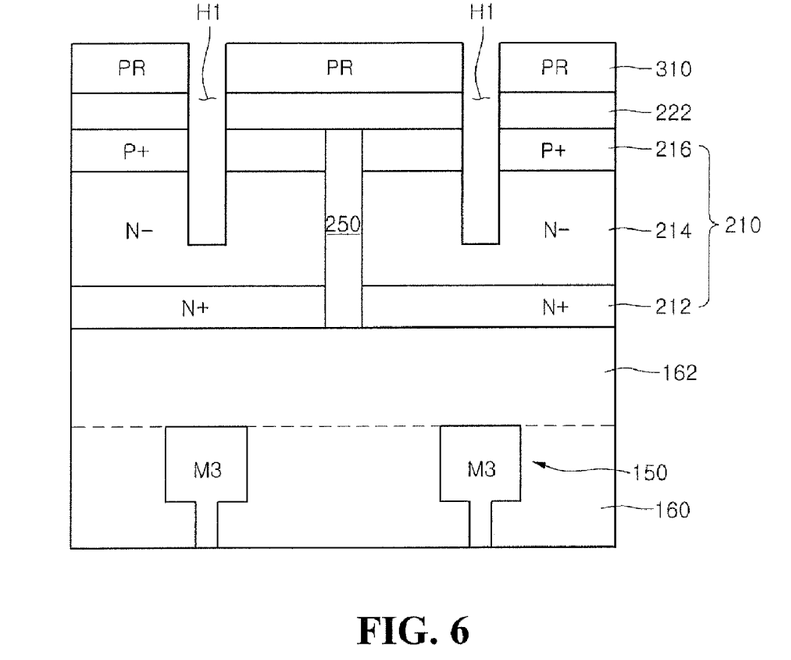

Referring to FIG. 6, first via holes H1 can be formed by partially removing the second conductive type layer 216 of the image sensing device 210. The first via holes H1 can be formed by partially removing the second conductive type layer using the photoresist pattern 310 as an etch mask, so as to expose a portion of the first conductive type second layer 214. The first via holes H1 are not deep enough to expose the first conductive type first layer 212 below the first conductive type second layer 214. For example, the first via holes H1 can be formed by partially removing a P+ layer (216) using the photoresist pattern 310 as an etch mask, so as to expose an N− layer (214). The first via holes H1 can be deep enough to pass through the second conductive type layer 216, but not deep enough to reach the first conductive type first layer 212 having high concentration.

According to an embodiment, a third wet etch process can be performed on surfaces of the image sensing device 210 exposed through the first via holes H1. The third wet etch can be performed with, for example, a TMAH solution, though embodiments are not limited thereto. According to embodiments, a dangling bond of a damaged silicon surface can be removed through a wet etch process, so as to inhibit the occurrence of a dark current.

Figure 7:
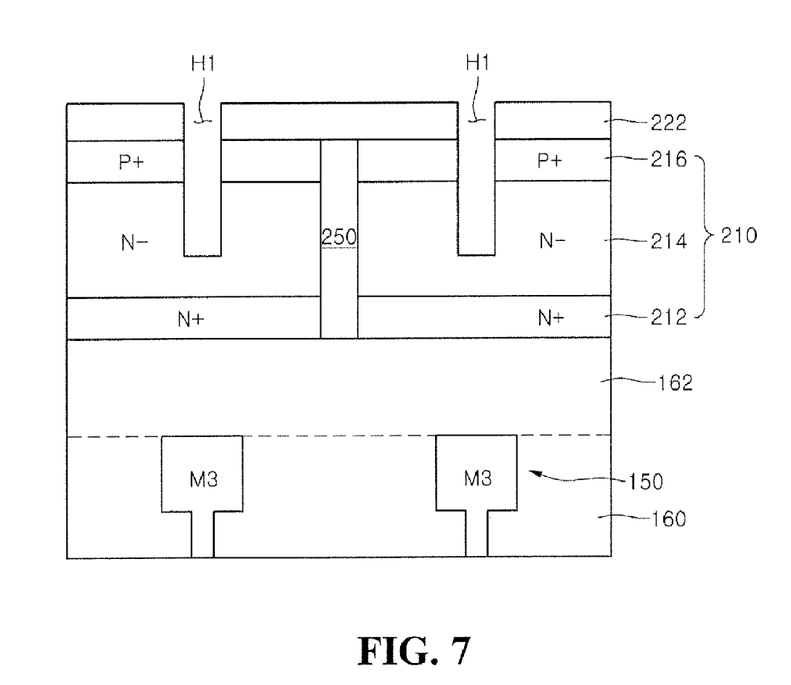

Referring to FIG. 7, the photoresist pattern 310 can be removed.

Figure 8:
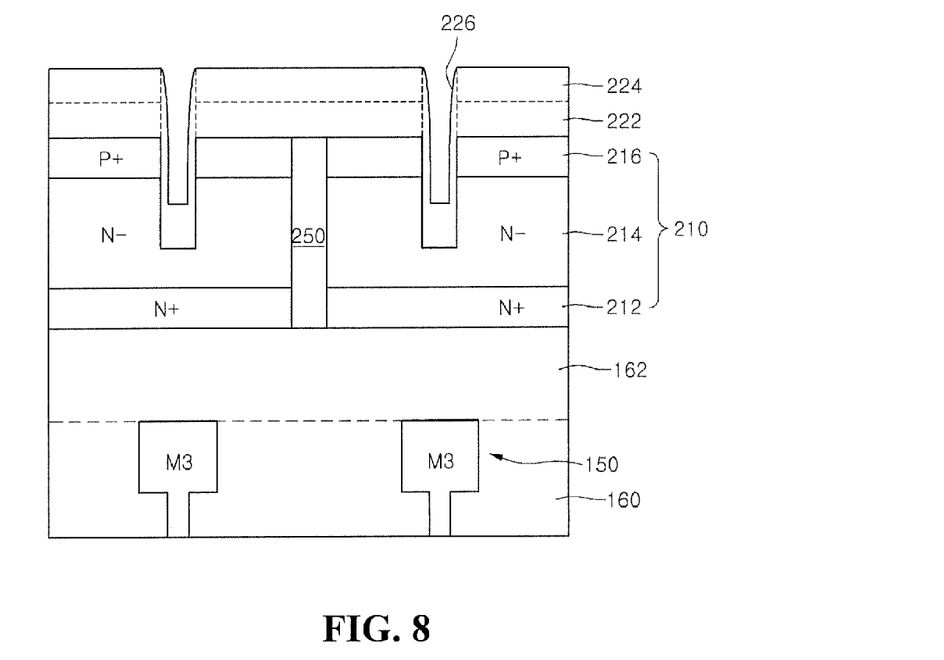

Referring to FIG. 8, the sidewall dielectric 226 can be formed on the sidewall of the second conductive type layer 216. The sidewall dielectric can also be formed on a portion of the sidewall of the first conductive type second layer 214. For example, a second dielectric 224 can be formed in the first via holes H1. The second dielectric 224 can be an oxide layer, though embodiments of the present invention are not limited thereto. Then, a blanket etch, such as an etch back, can be performed on the second dielectric 224 to form the sidewall dielectric 226 on the sidewall of the second conductive type layer 216.

In an embodiment, the contact plug 230 passing through the image sensing device 210 can be insulated using the sidewall dielectric 226 to inhibit the occurrence of a short at the contact plug 230 connecting the readout circuitry 120 and the image sensing device 210.

Figure 9:
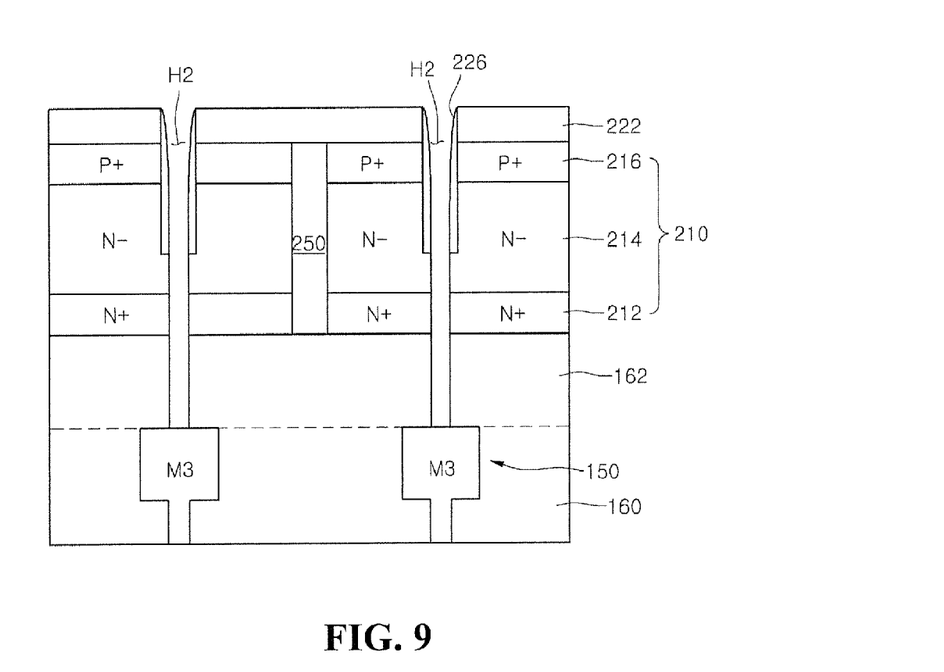

Referring to FIG. 9, second via holes H2, at least partially in line with the first via holes H1 can be formed to expose the interconnection 150. The second via holes H2 can be formed using the sidewall dielectric 226 as an etch mask. For example, the second via holes H2 can pass through the image sensing device 210 and the second interlayer dielectric 162 to expose an upper portion of the interconnection 150.

According to an embodiment, a fourth wet etch process can be performed on surfaces of the image sensing device 210 exposed through the second via holes H2. For example, the fourth wet etch can be performed with a TMAH solution, though embodiments are not limited thereto. According to embodiments, a dangling bond of a damaged silicon surface can be removed through a wet etch process, so as to inhibit the occurrence of a dark current.

Figure 10:
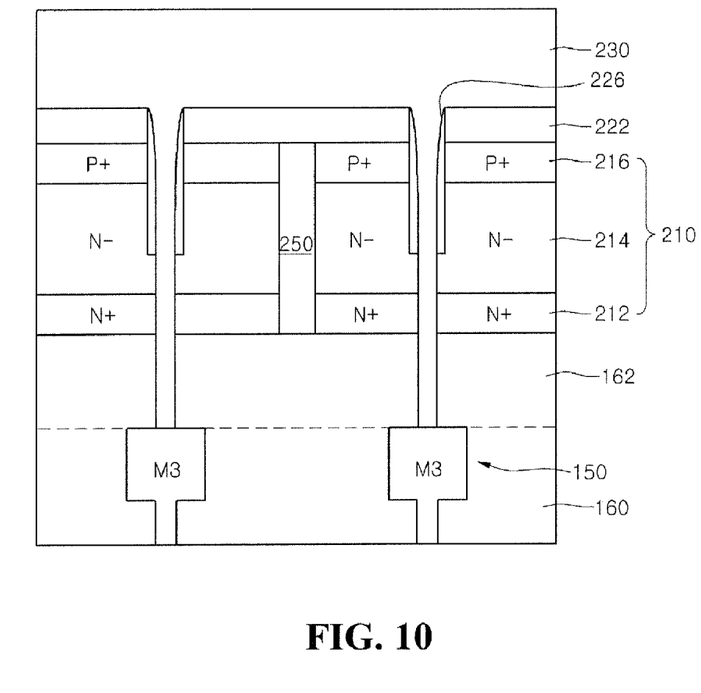

Referring to FIG. 10, the contact plug 230, connecting the first conductive type second layer 214 and the interconnection 150, can be formed in the second via holes H2. The contact plug 230 filling the second via holes H2 can be formed of, for example, metal such as tungsten (W) and/or titanium (Ti).

Figure 11:
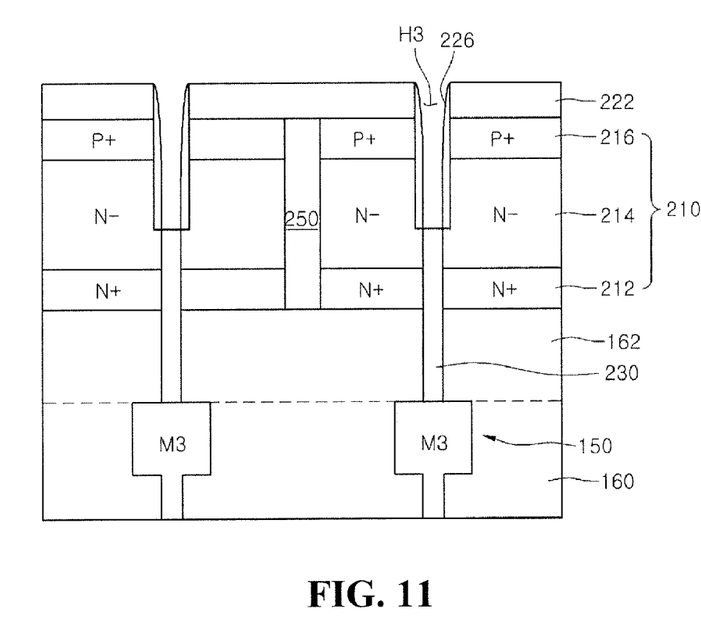

Referring to FIG. 11, a portion of the contact plug 230 can be removed to form third via holes H3. For example, a portion of the contact plug 230 can be removed such that an upper surface of the contact plug 230 is lower than a lower surface of the second conductive type layer 216. For example, a portion of the contact plug 230 can be removed through a blanket etch.

Figure 12:
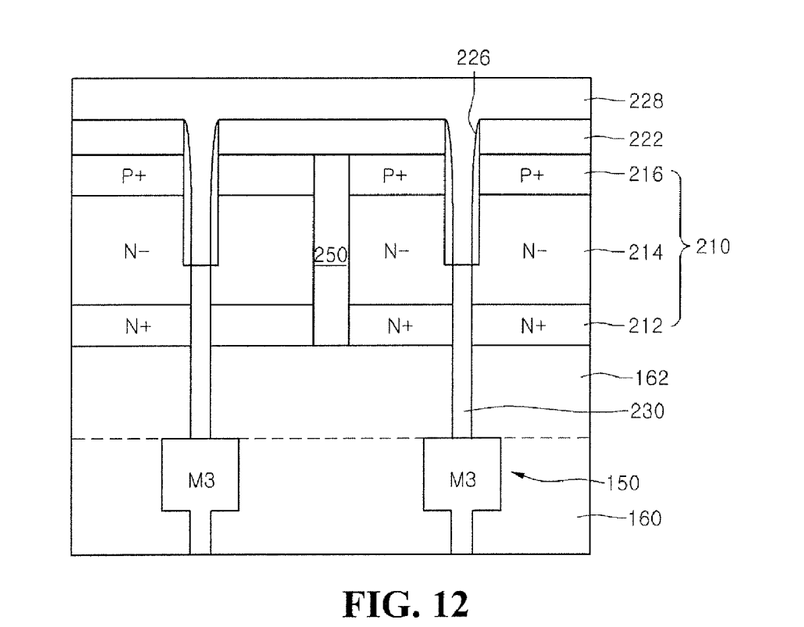

Referring to FIG. 12, a third dielectric 228 can be formed in the third via holes H3. The third dielectric 228 can be any suitable material known in the art, for example, an oxide layer.

Then, a ground process can be performed on the second conductive type layer 216.

According to embodiments of the present invention, the contact plug 230 passing through the image sensing device 210 can be insulated using the sidewall dielectric 226 to avoid a short at the contact plug 230 connecting the readout circuitry 120 and the image sensing device 210.

Figure 13:
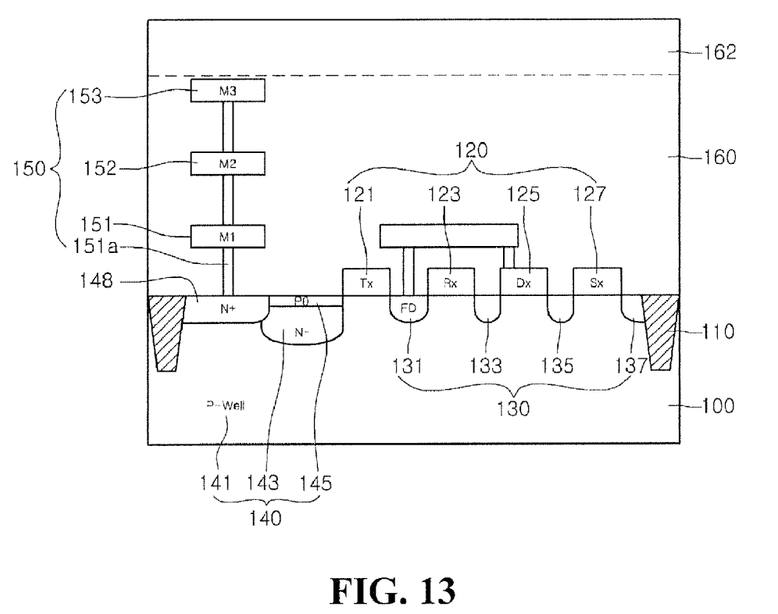
FIG. 13 is a cross-sectional view showing an image sensor according to an embodiment of the present invention.

FIG. 13 is a cross-sectional view showing an image sensor according to an embodiment of the present invention. The first substrate 100 provided with the interconnection 150 is illustrated in detail.

Referring to FIG. 13, a first conductive type connection 148 can be formed at a side of (and electrically connected to) the electrical junction region 140.

The N+ connection region 148 may be formed at the P0/N−/P− junction 140 for an ohmic contact. In this case, a leakage source may be generated during the formation process of the N+ connection region 148 and the M1C contact 151a.

The first conductive type connection 148, which can be for example an N+ connection region, can be formed at a side of the electrical junction 140 (e.g., a P0/N−/P− junction) for an ohmic contact. This can cause an electric field to be generated due to N+/P0 junction 148/145. This electric field can become a leakage source.

Accordingly, in an embodiment of the present invention, a layout is provided in which the first contact plug 151a can be formed in an active region not doped with a P0 layer, but rather includes an N+ connection region 148 that is electrically connected to the N− layer 143.

According to embodiments, an electric field may not be generated on and/or over a silicon surface; this can lead to a reduction in a dark current of a 3D integrated CIS.

According to embodiments of the present invention, a dangling bond of a damaged silicon surface can be removed through a wet etch process, so as to inhibit the occurrence of a dark current.

In addition, according to embodiments, a device can be designed to provide a potential difference between the source and drain of the transfer transistor (Tx), thereby enabling the full dumping of a photo charge.

Moreover, according to embodiments, the conductive type connection can be formed between the photodiode and the readout circuit to create a smooth transfer path of a photo charge, thereby making it possible to minimize a dark current source and inhibit saturation reduction and sensitivity degradation.

Furthermore, according to embodiments, the contact plug passing through the image sensing device can be insulated using a sidewall dielectric to avoid a short at the contact plug connecting the readout circuitry and the image sensing device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor, the method comprising:
   forming a readout circuitry on a first substrate;
   forming an interlayer dielectric on the first substrate
   forming an interconnection in the interlayer dielectric, the interconnection being electrically connected to the readout circuitry;
   providing a second substrate with an image sensing device, the image sensing device comprising a first conductive type layer and a second conductive type layer;
   bonding the second substrate on the interlayer dielectric;
   removing a portion of the second substrate that does not include the image sensing device; and
   performing a first wet etch process on an exposed surface of the image sensing device after removing a portion of the second substrate;
   removing a portion of the second conductive type layer of the image sensing device to form a first via hole;
   forming a sidewall dielectric on a sidewall of the second conductive type layer in the first via hole;
   removing a portion of first conductive type layer and the interlayer dielectric using the sidewall dielectric as an etch to form a second via hole exposing the interconnection; and
   forming a contact plug electrically connecting the first conductive type layer to the interconnection through the second via hole.

2. The method according to claim 1, further comprising forming an electrical junction region electrically connected to the readout circuitry on the first substrate.

3. The method according to claim 2, wherein forming the electrical junction region comprises:
   forming a first conductive type ion implantation region on the first substrate; and
   forming a second conductive type ion implantation region on the first conductive type ion implantation region.

4. The method according to claim 3, wherein the readout circuitry comprises at least one transistor having a source and a drain, and wherein the readout circuitry has a potential difference between the source and the drain of the at least one transistor.

5. The method according to claim 2, further comprising forming a first conductive type connection between the electrical junction region and die interconnection,
   wherein the first conductive type connection is disposed on the electrical junction region and electrically connected to the interconnection.

6. The method according to claim 2, further comprising forming a first conductive type connection between the electrical junction region and the interconnection,
   wherein the first conductive type connection is disposed at a side of the electrical junction region and electrically connected to the interconnection.

7. The method according to claim 1, wherein the forming of the sidewall dielectric comprises:
   forming a second dielectric in the first via hole; and
   blanket etching the second dielectric.

8. The method according to claim 1, further comprising, after forming the contact plug,
   removing a portion of the contact plug, such that an upper surface of the contact plug is lower than a lower surface of the second conductive type layer, to form a third via hole; and
   forming a third dielectric in the third via hole.

9. The method according to claim 1, further comprising performing a second wet etch process after forming the second via hole.

* * * * *